US011985901B2

(12) United States Patent
Bikumala et al.

(10) Patent No.: US 11,985,901 B2
(45) Date of Patent: May 14, 2024

(54) USING THERMAL ENERGY, KINETIC ENERGY, OR BOTH TO CHARGE A DEVICE (71) Applicant: Dell Products L. P., Round Rock, TX (US)

(72) Inventors: Sathish Kumar Bikumala, Round Rock, TX (US); Jace W. Files, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 769 days.

(21) Appl. No.: 16/671,419

(22) Filed: Nov. 1, 2019

(65) Prior Publication Data

US 2021/0135088 A1 May 6, 2021

(51) Int. Cl.
*G06F 3/0354* (2013.01)
*G01P 15/00* (2006.01)
*H10N 10/17* (2023.01)
*H10N 30/30* (2023.01)
*H01M 10/42* (2006.01)

(52) U.S. Cl.
CPC ........... *H10N 30/30* (2023.02); *G01P 15/005* (2013.01); *G06F 3/03545* (2013.01); *H10N 10/17* (2023.02); *H01M 10/4257* (2013.01); *H02J 2207/40* (2020.01)

(58) Field of Classification Search
CPC .................................................. G06F 3/03545
See application file for complete search history.

(56) References Cited

U.S. PATENT DOCUMENTS

2019/0339649 A1\* 11/2019 Zhou .......................... F03G 5/06

\* cited by examiner

*Primary Examiner* — Ramon M Barrera
(74) *Attorney, Agent, or Firm* — Krishnendu Gupta; Deepika Bhayana; Lesley A. Leonessa (57) ABSTRACT In some examples, a device includes a charging circuit with a thermoelectric generator and a kinetic energy generator. An embedded controller (EC) monitors a level of a battery in the device. If the level falls below a threshold, the EC may determine, using an accelerometer, whether the device is in motion. If the device is in motion, the EC may use the kinetic energy generator to charge the battery. If the device is not in motion, the EC may determine, using a temperature sensor, whether there is a temperature difference between two portions of the device. If there is a temperature difference, then the EC may use the thermoelectric generator to charge the battery. If the EC determines that the device is not in motion and there is no temperature difference between the two portions, then the EC may instruct the user to charge the device.

14 Claims, 6 Drawing Sheets

USING THERMAL ENERGY, KINETIC ENERGY, OR BOTH TO CHARGE A DEVICE

BACKGROUND OF THE INVENTION

Field of the Invention

This invention relates generally to electronic devices, including a computing device (e.g., laptop, tablet, smartphone, smartwatch, or the like) and a stylus, and more particularly, to charging a battery of the device using (i) kinetic energy created when the device is in motion and/or (ii) a thermoelectric generator that uses a temperature differential between two sections of the device.

Description of the Related Art

As the value and use of information continues to increase, individuals and businesses seek additional ways to process and store information. One option available to users is information handling systems (IHS). An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Modern information handling systems (IHS) may include many different types of consumer and commercial electronic devices such as, for example, personal computers (e.g., desktops or laptops), tablet computers, mobile devices (e.g., personal digital assistants (PDAs) or smart phones), User Equipment (UE), corporate (or small business) server and data processing systems, and the like. These devices may vary in size, shape, performance, functionality, and price. In addition to supporting data processing and computing functionalities, these devices also offer wireless communication capabilities for voice, picture, video, and/or other data communication.

A touchscreen computing device, such as a tablet or a two-in-one device, may receive input from a stylus (also referred to as an "active pen"), which includes electronic components and allows users to write directly onto the touch-screen surface of a display associated with the computing device. The stylus may be used for digital notetaking, electronic document annotation, on-screen digital drawing or painting, as well as for accurate object selection and scrolling. A stylus may use (i) non-chargeable batteries that last several (e.g., six to nine) months on one battery or (ii) rechargeable batteries. For rechargeable batteries, either the stylus or the batteries must be placed in a charger to charge the batteries. The main issue for a manufacturer is that when the stylus stops working, the user may not understand (at least initially) why the stylus has stopped working, thereby creating a bad user experience.

Portable computing devices (e.g., smartwatches, smartphones, tablets, laptops, and the like) also use one or more rechargeable batteries that must be charged periodically. When the battery level becomes low, the user must find an alternating current (A/C) wall in order to continue using the portable computing device.

SUMMARY OF THE INVENTION

This Summary provides a simplified form of concepts that are further described below in the Detailed Description. This Summary is not intended to identify key or essential features and should therefore not be used for determining or limiting the scope of the claimed subject matter.

In some examples, a device may include a charging circuit that includes a thermoelectric generator and a kinetic energy generator. An embedded controller (EC) in the charging circuit may monitor a level of a battery in the device. If the level falls below a first threshold, the EC may determine, using motion data from an accelerometer, whether the device is in motion. If the device is in motion, the EC may use the kinetic energy generator to convert motion into electricity to charge the battery. If the device is not in motion, the EC may determine, using temperature data from a temperature sensor, whether there is a significant temperature difference between two portions (e.g., a thermocouple) of the device. If there is a significant temperature difference, then the EC may use the thermoelectric generator to charge the battery. If the EC determines that the device is not in motion and there is no significant temperature difference between the two portions, then the EC may instruct the user to charge the device, e.g., by connecting a power source to the device or by moving the device.

BRIEF DESCRIPTION OF THE DRAWINGS

A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

DETAILED DESCRIPTION

For purposes of this disclosure, an information handling system (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or video display. The information handling system may also include one or more buses operable to transmit communications between the various hardware components.

The systems and techniques described herein may enable a device to convert kinetic energy (e.g., movement) to electricity and convert thermal energy (a temperature differential between two sections of the device) to electricity and use the electricity to charge one or more rechargeable batteries that power the device. The device may be a stylus or a computing device, such as, for example, a smartwatch, a smartphone, a tablet, a laptop, a 2-in-1 (e.g., a tablet that can be attached to a keyboard to create a laptop), or the like. While a single representative battery is referred to in the examples below, it should be understood that multiple batteries may be used and a single battery may include multiple cells.

For example, the stylus may use a thermoelectric generator (e.g., a thermocouple), a kinetic energy harvesting device ("kinetic energy device"), or both to generate electricity. A thermocouple refers to an electrical device including two dissimilar electrical conductors or semiconductors forming electrical junctions at differing temperatures. A thermocouple may produce a temperature-dependent voltage as a result of the thermoelectric effect, and this voltage may be used to recharge one or more rechargeable batteries. The thermocouple may generate electricity based on a temperature difference between a first portion of the stylus that is heated from a user's hand and/or fingers when the user is holding the stylus. In addition, when the stylus is not in use and placed in a holder located next to an enclosure of a computing device, the stylus may generate electricity based on a temperature differential between a first portion of the stylus that is heated using heat from heat-generating components located in the computing device and a second portion of the stylus that is at (approximately) an ambient temperature. For example, when the stylus is placed in (and held by) a stylus holder located outside an enclosure of the computing device, the heat generated by the heat-generating components may be directed towards the stylus to enable the stylus to generate energy to recharge the batteries of the stylus. To generate electricity to charge a battery, the computing device may use a thermocouple that uses the temperature differential between a first portion of the device that includes heat generating components (e.g., central processing unit (CPU), memory, storage device, or the like) and a second portion of the device that does not include the heat generating components.

The stylus, the computing device or both may each include a kinetic energy device to convert kinetic energy (e.g., motion) to electricity. The kinetic energy device may use either a piezoelectric generator or a linear induction generator to generate electricity. A piezoelectric generator may include a hollow chamber having a piezo element at one end of the chamber, a spring at the opposite end of the chamber, and a weighted object that can move within the chamber. As the device is moved, the weighted object may move back and forth within the chamber, repeatedly hitting the piezo element, causing the piezo element to generate alternating current (A/C) (e.g., electricity). The A/C may pass through a bridge rectifier (e.g., diode rectifier) that converts the A/C to direct current (DC). A capacitor may be used to store the DC and to smooth out the fluctuations (e.g., voltage swings) in the DC voltage prior to using the DC voltage to charge a battery (e.g., rechargeable battery). The linear induction generator may include a tube with wire coiled around the outside of the chamber and a magnet (e.g., rare earth magnet, such as a neodymium magnet) that can move within the chamber. As the device is moved, the magnet may move back and forth within the chamber, inducing alternating current (A/C) (e.g., electricity) within the wire coils. The A/C may pass through a bridge rectifier (e.g., diode rectifier) that converts the A/C to direct current (DC). A capacitor (e.g., a supercapacitor) may be used to store the DC and to smooth out the fluctuations (e.g., voltage swings) in the DC voltage prior to using the DC voltage to charge a battery (e.g., rechargeable battery). Thus, a sliding rare earth magnet moves back and forth through the center of a solenoid (e.g., a coil of wire) when the stylus or the computing device is being moved. A current is induced in the loops of wire by Faraday's law of induction each time the magnet slides through to charge a battery.

Thus, when a user is transporting or using a stylus, the kinetic energy device may use the movement caused when the stylus is being transported to charge the stylus battery. Similarly, when a user is transporting a computing device (e.g., smartwatch, smartphone, tablet, laptop, or 2-in-1), the kinetic energy device may use the movement caused when the computing device is being transported to charge the battery in the computing device. When a user is holding a stylus or when the stylus is stored adjacent to a computing device that is being used (or was recently used), a thermoelectric generator may use a temperature differential between different portions of the stylus to generate electricity to charge the battery. When a user is using a computing device, a thermoelectric generator may use a temperature differential between different portions of the device to generate electricity to charge the battery.

In some cases, the stylus, the computing device or both may each use both kinetic energy generation and a thermocouple to generate electricity to charge a battery. An embedded controller may monitor a level of a battery. An embedded controller (EC) is a microcontroller that typically handles tasks that the main processor (e.g., central processing unit (CPU)) does not handle. The EC may include logic to execute instructions stored in firmware. When the battery level falls below a predetermined threshold, the circuit may determine if the stylus or the computing device is in motion. If the stylus or the computing device is in motion, then the circuit may use electricity generated by the kinetic energy generator to charge the battery. If the EC determines that the stylus or the computing device is stationary (e.g., not in motion), then the EC may determine if there is a temperature differential between two portions (e.g., a thermocouple) of the stylus or the device sufficient to generate electricity. If there is a temperature differential between two portions of the stylus or the device sufficient to generate electricity, then the EC may use the electricity generated by the thermoelectric generator charge the battery. If the EC determines that the stylus is not in motion and the temperature differential between two portions of the stylus is insufficient to generate electricity, then the EC may send an alert from the stylus to the computing device. The alert may display a message indicating that the battery level is below the predetermined threshold and instructing the user to (i) move the stylus back and forth (or twirl the stylus) to recharge the battery, (ii) plug a charger into the stylus, or (iii) change the batteries of the stylus. For example, in terms of moving the stylus back and forth to recharge the battery, the instruction may recommend that the user move the stylus at least a predetermined distance (e.g., X inches or more, X=6, 8, 10, 12, 18, 24 or the like) a predetermined number of times (e.g., Y or more times, Y-10, 15, 20, or the like).

As an example, a device, such as a computing device or a stylus, may include a charging circuit. The charging circuit may include (i) a kinetic energy generator, (ii) a battery, (iii) a plurality of sensors that include at least an accelerometer and a thermometer, and (iv) an embedded controller (EC). The embedded controller may be configured with logic instructions to perform various operations. For example, the operations may include determining that a level of the battery is below a first predetermined threshold. The operations may include receiving motion data from the accelerometer. If the EC determines, based on the motion data, that the device is being moved (e.g., the device is in motion), then the EC may connect an output of the kinetic energy generator to an input of the battery to charge the battery. For example, a first type of kinetic energy generator may include: (i) a chamber, (ii) a spring located at one end of the chamber, (iii) a piezo element located at an opposite end of the chamber, and (iv) a weighted object inside the chamber. When the chamber experiences motion, the weighted object may either hit the piezo element at one end of the chamber or bounce off the spring at the other end of the chamber and hit the piezo element. Each time the weighted object hits the piezo element, the piezo element may generate electricity (e.g., in accordance with the piezoelectric effect). A second type of kinetic energy generator may include: a chamber; a first spring located at one end of the chamber; a second spring located at an opposite end of the chamber; wire coiled around an exterior surface of the chamber; and a neodymium magnet inside the chamber, wherein when the chamber experiences motion, the weighted object travels inside the chamber between the first spring and the second spring to induce a current in the wire.

In some cases, the charging circuit may include a thermoelectric generator. For example, the EC may determine that the level of the battery is below the first predetermined threshold and receive second motion data from the accelerometer. If the EC determines, based on the motion data, that the device is stationary, then the EC may receive temperature data from a thermometer of the plurality of sensors. If the EC determines, based on the temperature data, that a temperature difference between a first portion of the device and a second portion of the device satisfies a second predetermined threshold, then the EC may connect an output of the thermoelectric generator to the input of the battery to charge the battery. As another example, if the EC determines that the level of the battery is below the first predetermined threshold, then the EC may receive second motion data from the accelerometer and determine, based on the motion data, that the device is stationary. The EC may receive temperature data from a thermometer of the plurality of sensors. If the EC determines, based on the temperature data, that a temperature difference between a first portion of the device and a second portion of the device fails to satisfy a second predetermined threshold, then the EC may instruct the user to charge the battery. For example, the EC may instruct the user to perform at least one of: (i) placing the device on a charging mat to wirelessly charge the battery, (ii) connecting a power source (e.g., AC to DC power supply) to the device to charge the battery, (iii) or moving the device at least a predetermined distance, at least a predetermined number of times.

Figure 1:
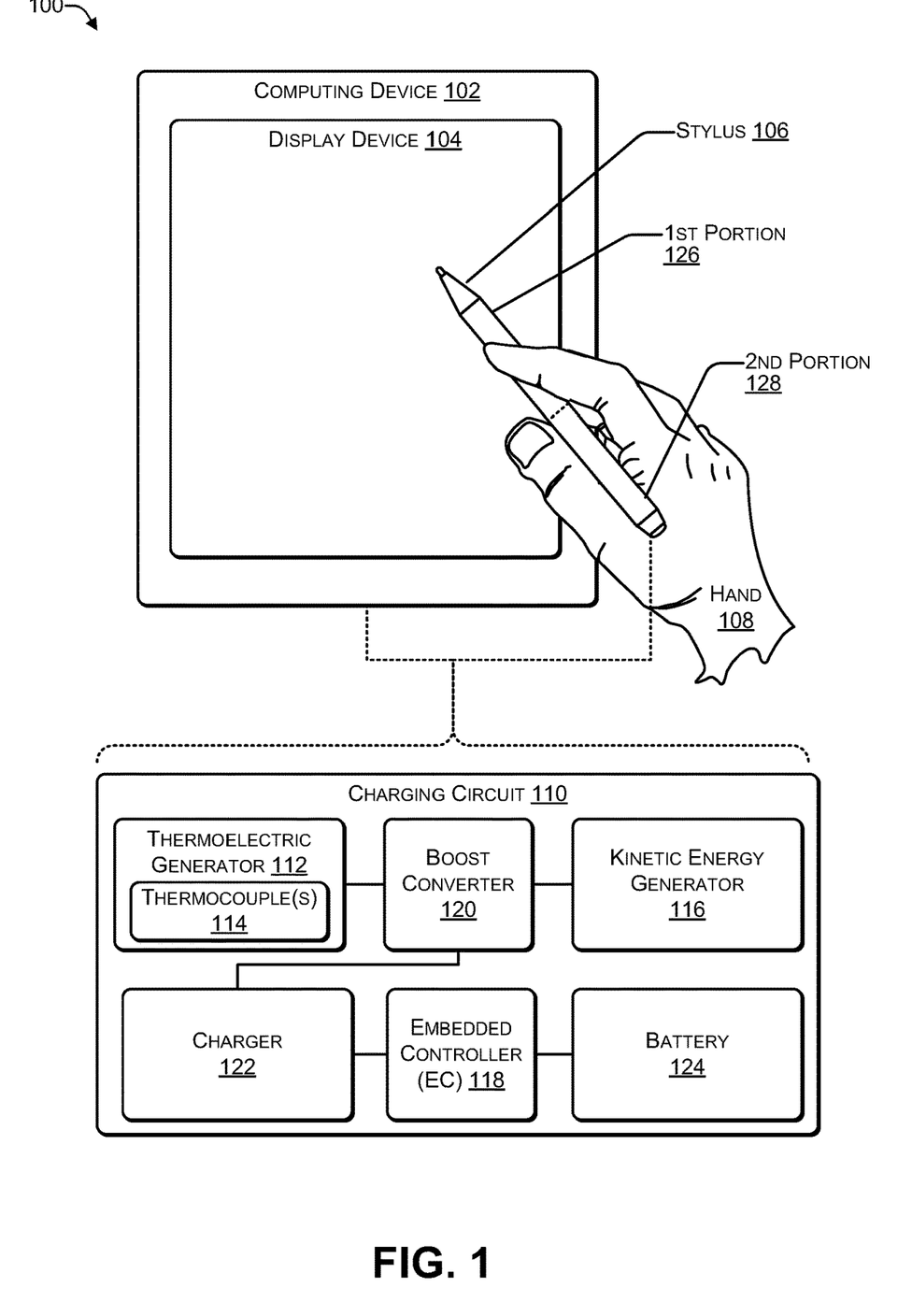
FIG. 1 is a block diagram of a system that includes a computing device and a stylus that each may use kinetic energy, a thermoelectric generator, or both to charge a battery, according to some embodiments.

FIG. 1 is a block diagram of a system 100 that includes a computing device and a stylus that each may use kinetic energy, a thermoelectric generator, or both to charge a battery, according to some embodiments. In the system 100, a computing device 102 may include a touchscreen display device 104. A user may use a stylus 106 to provide input to the computing device 102 by manipulating the stylus 106 on the display device 104. The computing device 102, the stylus 106, or both may include a charging circuit 110.

The charging circuit 110 may include (i) a thermoelectric generator 112 that includes one or more thermocouples, (ii) a kinetic energy generator (e.g., generates electricity based on kinetic energy), or both. The thermoelectric generator 112 may generate electricity based on a temperature differential between two different portions of a device. For example, when the stylus 106 includes the charging circuit 110, the thermoelectric generator 112 may generate electricity based on a temperature differential between a first portion 126 of the stylus 106 and a second portion 128 of the stylus 106. For example, because the second portion 128 is being grasped by the user's hand 108, the second portion 128 may have a higher temperature than the first portion 126.

The thermoelectric generator (TEG) 112 is a solid-state device that converts heat flux (temperature differences) into electrical energy using a phenomenon known as the Seebeck effect (a form of thermoelectric effect). The thermoelectric generator 112 may generate power directly from heat by converting a temperature difference into electric voltage using materials that have both a high electrical conductivity ($\sigma$) and a low thermal conductivity ($\kappa$). Low thermal conductivity provides that when one side is made hot, the other side stays cold, which helps to generate a large voltage while in a temperature gradient. The measure of the magnitude of electrons flow in response to a temperature difference across that material is given by the Seebeck coefficient (S). The efficiency of a given material to produce a thermoelectric power is governed by its "figure of merit" $zT=S2\sigma T/\kappa$, Where $\sigma$ is the local conductivity, S is the Seebeck coefficient (also known as thermopower), a property of the local material. For example, three semiconductors known to have both low thermal conductivity and high power factor include bismuth telluride ($Bi_2Te_3$), lead telluride (PbTe), and silicon germanium (SiGe). The thermal conductivity of semiconductors can be lowered without affecting their high electrical properties using nanotechnology. This can be achieved by creating nanoscale features such as particles, wires or interfaces in bulk semiconductor materials.

The thermoelectric generator 112 may use the thermocouples 114, e.g., two dissimilar thermoelectric materials joined at their ends. For example, an n-type (with negative charge carriers) semiconductor may be joined with a p-type (with positive charge carriers) semiconductor. Electric current flows when there is a temperature difference between the ends of the materials. The magnitude of the current is directly proportional to the temperature difference. For example, the first portion 126 may include an n-type semiconductor and the second portion 128 may include a p-type semiconductor. When the stylus 106 is being held by the hand 108, the thermoelectric generator 112 may use the temperature difference between the portions 126, 128 to generate electricity.

The kinetic energy generator 116 may generate electricity based on movement. For example, when the stylus 106 includes the charging circuit 110, the kinetic energy generator 116 may generate electricity when the stylus 106 is being transported or when the stylus 106 is being manipulated by a user to provide input to the computing device 102 using the touchscreen display device 104. The kinetic energy generator 116 may use a piezo element, as described in more detail in FIG. 2, or a magnetic induction system, as described in more detail in FIG. 3.

An embedded controller (EC) 118 may monitor a charge level of a battery 124. The charging circuit 110 may include a boost converter 120. The boost converter 120 is a DC-to-DC power converter that steps up voltage (while stepping down current) from its input (supply) to its output (load). To reduce voltage ripple, a filter that includes a capacitor may be used. The charger circuit 110 may include a charger 122 that accepts voltage from an AC to DC power supply to charge the battery 124. The battery 124 may be a rechargeable battery that uses a rechargeable technology, such as, for example, zinc oxide, nickel cadmium, lithium ion, or the like. The EC 118 may determine when to charge the battery and whether to use the thermoelectric generator 112, the kinetic energy generator 116, the charger 122, or any combination thereof to charge the battery 124. In some cases, the charger 122 may use wireless charging (e.g., inductive charging) to charge the battery 124. For example, placing the computing device 102 or the stylus 106 on a charging pad may cause electricity to be induced into coils in the charger 122, enabling the charger 122 to charge the battery 124.

Thus, a computing device, a stylus, or both may use a charging circuit to charge a battery. The charging circuit may include a thermoelectric generator, a kinetic energy generator, or both. The battery may also be charged using a charger (e.g., charging circuit) that takes AC or DC voltage provided by a power supply that is connected to an AC outlet. An embedded controller (EC) may determine which combination of the thermoelectric generator, the kinetic energy generator, or the charger to use when charging the battery. For example, if the EC determines that the stylus (or the computing device) is in motion (being moved), then the EC may use the kinetic energy generator to generate electricity. The EC may determine movement based on sensor data from a sensor, such as an accelerometer, that is built into either the stylus or the computing device.

Figure 2:
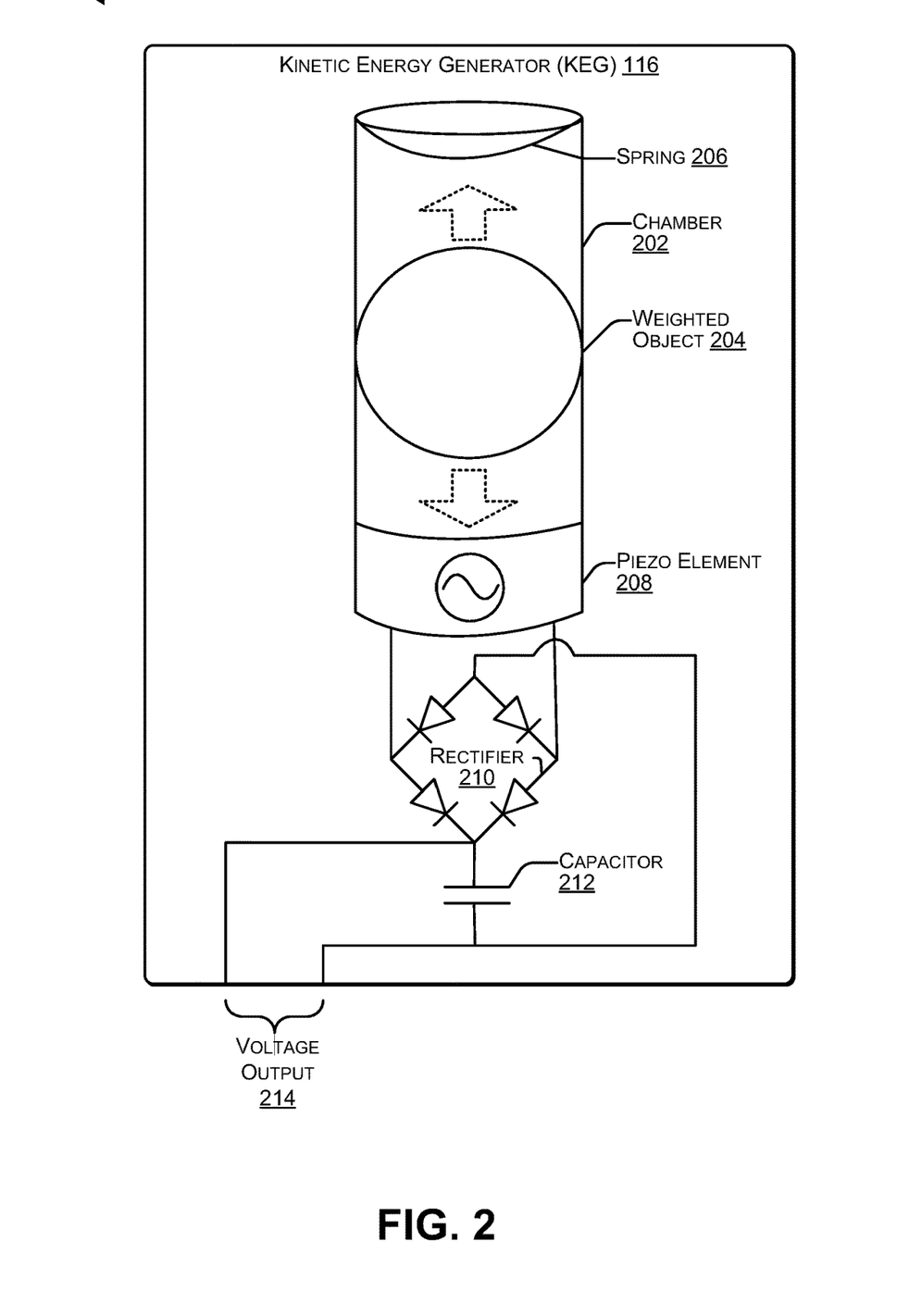
FIG. 2 is a block diagram of a first type of kinetic energy (harvesting) device, according to some embodiments.

FIG. 2 is a block diagram 200 illustrating a first type of kinetic energy (harvesting) device, according to some embodiments. The kinetic energy generator (KEG) 116 may generate electricity based on movement.

The KEG 116 may include a chamber 202 in which a weighted object 204 can travel back and forth based on movement. For example, the chamber 202 may be a tube (e.g., a cylindrical tube) and the weighted object 204 may be a spherical object. Of course, other geometric shapes may be used. For example, the chamber 202 may have a shape of a hollow box and the weighted object 204 may have a smaller, solid, box shape. As another example, the chamber 202 may be hollow and hexagonal shaped and the weighted object 204 may have a solid hexagonal shape. The outer surface of the weighted object 204 and the inner surface of the chamber 202 may be coated with a material that has a low amount of friction (e.g., coefficient of friction of between about 0.1 to about 0.01), such as, for example, Polytetrafluoroethylene (PTFE), Molybdenum Disulfide, Tungsten Disulfide, graphene, carbon-based coating with a graphitic microcrystalline structure, or a fluoropolymer.

One end of the chamber 202 may include a spring 206, such that when the weighted object 204 moves towards and strikes the spring 206, the spring 206 causes the weighted object 204 to move towards and strike a piezo element 208 located at an opposite end (e.g., relative to the spring 206) of the chamber 202. Thus, when a device (e.g., the computing device 102 or the stylus 106 of FIG. 1) that includes the KEG 116 is subject to movement, the weighted object 204 may repeatedly strike the piezo element 208 (e.g., deforming the piezo element 208), thereby causing the piezo element 208 to convert the mechanical force into electricity.

A bridge rectifier 210 may convert the electricity generated by the piezo element 208 into direct current (DC) voltage. A capacitor 212 may be used to reduce ripple in a voltage output 214 of the KEG 116.

Figure 3:
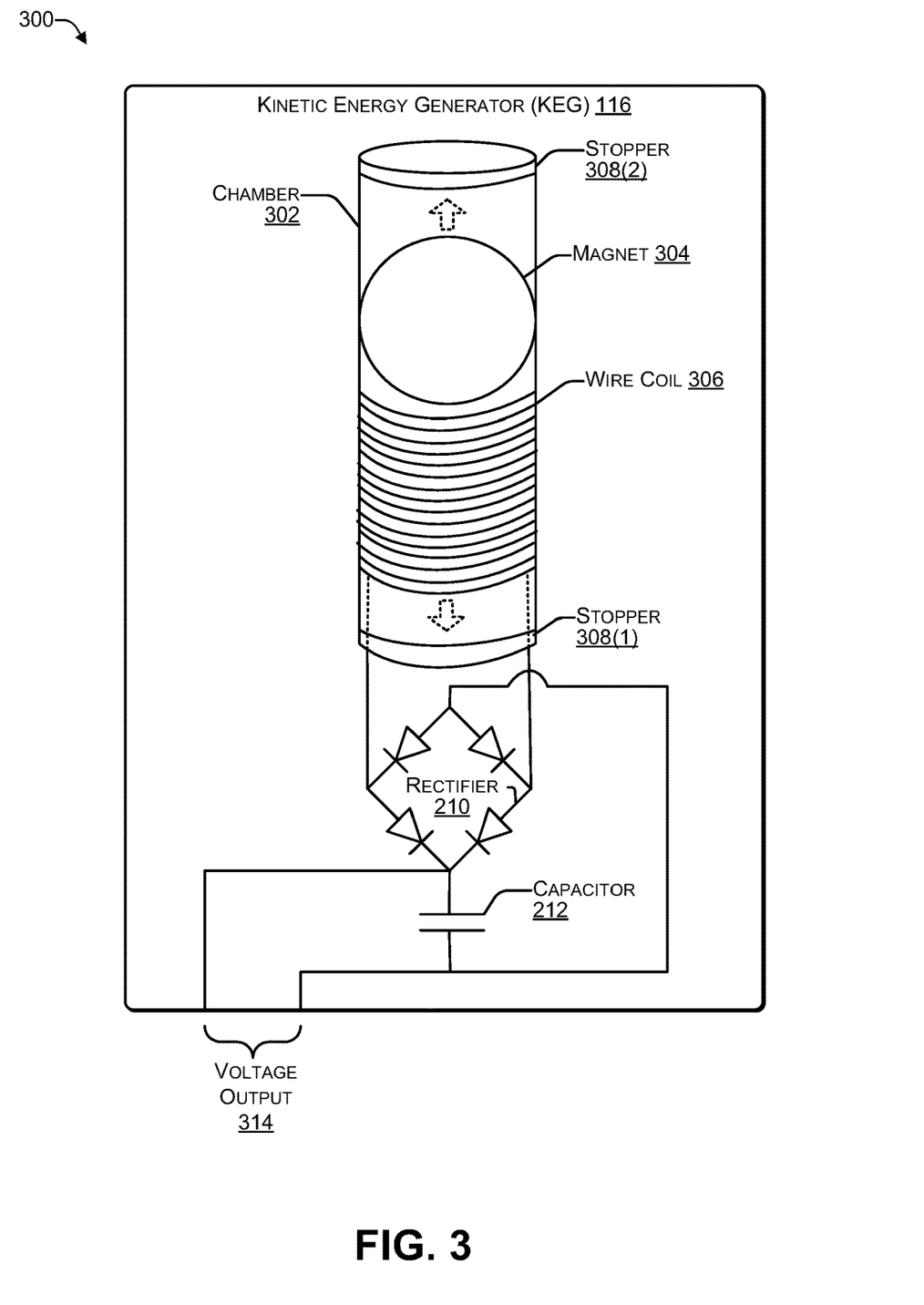
FIG. 3 is a block diagram of a second type of kinetic energy (harvesting) device, according to some embodiments.

FIG. 3 is a block diagram 300 illustrating a second type of kinetic energy (harvesting) device, according to some embodiments. For example, in some cases, the KEG 116 may use a linear induction motor to convert motion into electricity.

The KEG 116 may include a chamber 302 in which a magnet 304 can travel back and forth based on movement. For example, the chamber 302 may be a cylindrical tube and the magnet 304 may be spherical in shape. Of course, other geometric shapes may be used. For example, the chamber 302 may have a hollow box shape and the magnet 304 may have a smaller, solid, box shape. As another example, the chamber 302 may be hollow and hexagonal shaped and the magnet 304 may have a smaller solid hexagonal shape. The outer surface of the magnet 304 and the inner surface of the chamber 302 may be coated with a material that has a low amount of friction, such as, for example, Polytetrafluoroethylene (PTFE), Molybdenum Disulfide, or Tungsten Disulfide.

One end of the chamber 302 may include a stopper 308(1) and an opposite end of the chamber 302 may include a stopper 308(2). In some cases, the stoppers 308 may include a spring or other mechanism, such that striking one of the stoppers 308 causes the magnet 304 to travel towards the other of the stoppers 308. Thus, when a device (e.g., the computing device 102 or the stylus 106 of FIG. 1) that includes the KEG 116 is subject to movement, the magnet 304 may travel back and forth between the stoppers 308, causing an electrical current to be induced into a wire coil that is wrapped around an exterior surface (or embedded in a wall) of the chamber 302. The magnet 304 may use a rare earth element, such as, for example, neodymium.

The bridge rectifier 210 may convert the electricity induced into the wire coil 306 into direct current (DC) voltage. The capacitor 212 may be used to reduce ripple in a voltage output 314 of the KEG 116.

Figure 4:
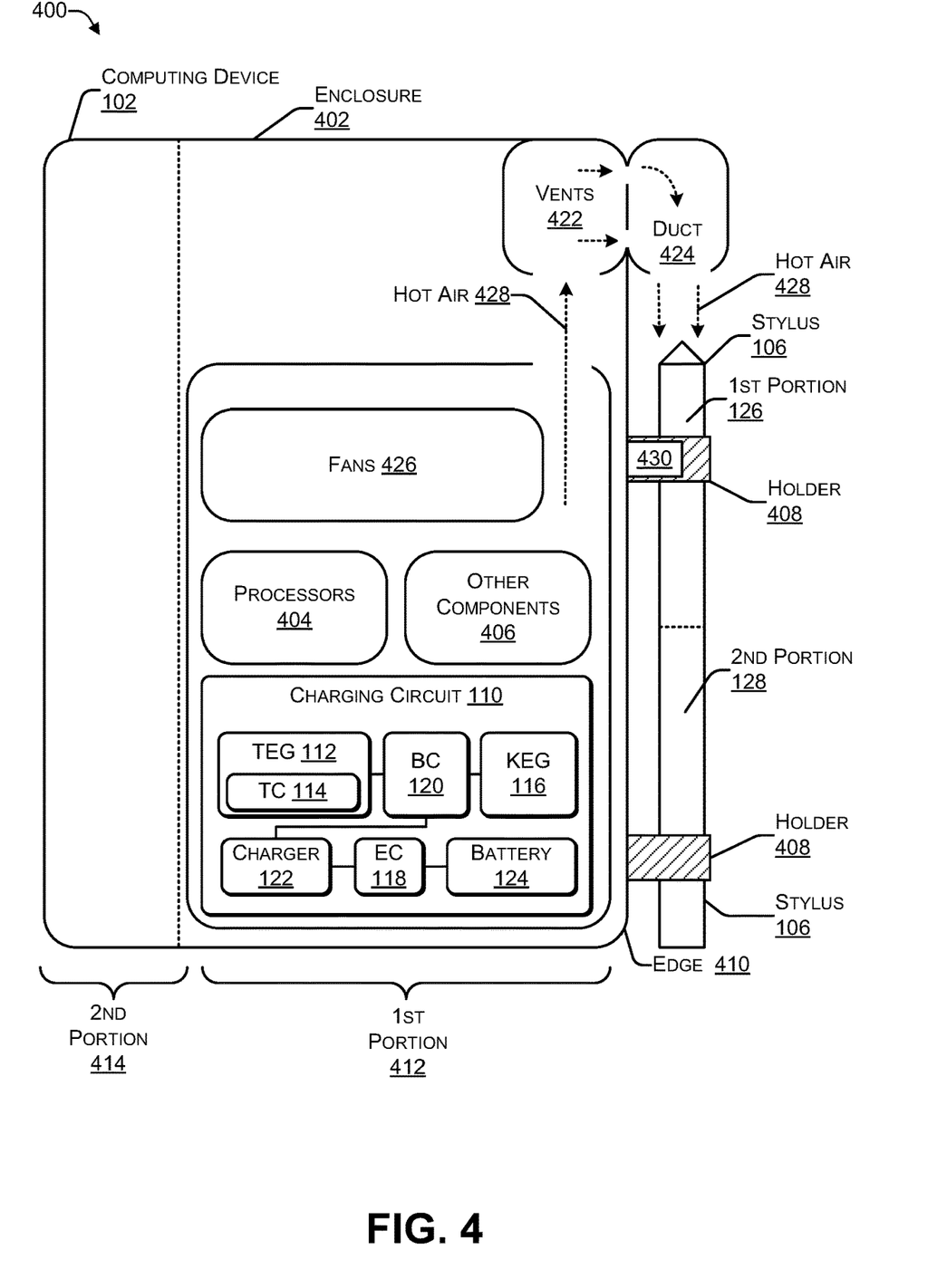
FIG. 4 is a block diagram of a system that includes a computing device and a stylus that use a thermoelectric generator to charge a battery, according to some embodiments.

FIG. 4 is a block diagram 400 of a system that includes a computing device and a stylus that use a thermoelectric generator to charge a battery, according to some embodiments.

The computing device 102 of FIG. 1 may include an enclosure 402 that may include a plurality of components, such as one or more processors 404 (e.g., Central Processing Unit (CPU)) and other heat-generating components 406. For example, the other heat-generating components 406 may include, but are not limited to, one or more non-transitory computer-readable storage media (e.g., random-access memory (RAM)), graphics processing units (GPU), digital signal processors (DSP), drives (e.g., hard drives, solid state drives (SSD), sensors, and other computer components. The computer-readable storage media may be configured to store instructions executable by the one or more processors 104. In some cases, the enclosure 402 may include the charging circuit 110.

A stylus holder 408 may be located on one edge 410 of the enclosure 402. The stylus holder 408 may be used to hold (e.g., store) the stylus 106 when the stylus 106 is not in use. The stylus holder 408 may be a physical sleeve (as illustrated in FIG. 4), or use magnets (e.g., magnets having a first polarity facing out from the stylus and magnets having a second opposite polarity located on the edge 410 of the enclosure), Velcro® (i.e., a hoop and loop, with the stylus having a loop surface and an edge of enclosure having a hook surface), or similar.

In some cases, the stylus holder 408 may include a fastener 430 that enables the stylus holder 408 to hold the stylus 106 in a fixed position when the stylus 106 is placed in the holder 408. For example, the fastener 430 may include a flexible pen clip, a C-shaped clip, or any similar fastening elements. As another example, the fastener 430 may include a magnet to attach the stylus 106 using magnetic force. In some cases, the fastener 430 may be capable providing power from the computing device 102 to the stylus 106.

The stylus 106 may be a pen-shaped tool configured to provide user input on a touch-based electronic device such as the computing device 102. The stylus 106 may include thermocouples that may be used to generate electricity to charge a battery that powers the stylus 106. The thermoelectric generator in the stylus 106 may use the thermocouples to generate electricity based on a temperature difference between two different portions of the stylus 106. For example, the stylus 106 may have a body that is made of at least two metals (the term metal as used herein refers to a pure metal or a metal alloy), with a first portion 126 including a first metal alloy and a second portion 128 including a second metal alloy. The metal (or metal alloy) portion of the stylus 106 may be attached together using a plastic or a third metal (or metal alloy). In this way, the two different metals, e.g., the portions 126, 128, may be used as the thermocouple.

The thermoelectric generator 112 may use the thermocouples 114 to generate electricity to charge the battery 124. For example, the heat generating components, such as the processors 404 and the other heat generating components 406 may be located in a first portion 412 of the enclosure 302. Thus, the first portion 412 of the enclosure 402 may have a higher temperature than a second portion 414, enabling the thermoelectric generator 112 to generate electricity using the temperature difference between the first portion 412 and the second portion 414.

Thus, a computing device that includes heat generating components may generate hot air inside an enclosure of the computing device. The hot air may exit from one or more vents. A duct may be temporarily attached (e.g., to an edge of the enclosure of the computing device) over the vents to redirect the hot air exiting the one or more vents. When the stylus is not being used, the stylus may be temporarily stored adjacent to the enclosure using a stylus holder. The duct may redirect the hot air towards a portion of the stylus when the stylus is being stored in the stylus holder. The hot air may increase a temperature of a portion of the stylus while a remaining portion of the stylus may have a lower temperature (e.g., due to the remaining portion of the stylus being in contact with an ambient environment surrounding the enclosure).

The stylus may include a thermoelectric generator (e.g., including thermocouples), a kinetic energy generator, and one or more rechargeable batteries. The thermoelectric generator in the stylus may use the temperature differential between the first portion of the stylus (e.g., that is heated by the hot air) and the remaining portion of the stylus (e.g., which is at or near an ambient temperature) to generate electricity to charge the rechargeable batteries. For example, the user may use the computing device, causing the components located inside the enclosure to generate heat. For example, the user may manipulate the stylus 106 against a touchscreen device of the computing device to provide input. When the stylus is being transported or being manipulated to provide input, a kinetic energy generator in the stylus 106 may generate electricity to charge the battery in the stylus. After the user has completed using the stylus, the user may store the stylus in the stylus holder. The thermoelectric generators in the stylus may generate electricity based on the temperature differential between the first portion of the stylus (e.g., that is heated by the hot air) and the remaining portion of the stylus (e.g., which is at or near an ambient temperature) and charge the rechargeable battery of the stylus. In this way, the battery of the stylus may be charged when the stylus is in motion and when the stylus is stored in the stylus holder. By charging the rechargeable battery, the stylus may be used for a longer period of time (as compared to non-rechargeable batteries), thereby enhancing user satisfaction.

The computing device may include a thermoelectric generator, a kinetic energy generator, or both. For example, heat generating components of the computing device may be placed in a first portion of the computing device. The thermoelectric generator may use the temperature difference between the first portion and a second portion that is cooler than the first portion to generate electricity. For example, the first portion may include one type of semiconductor material (e.g., n-type) while the second portion may include a second type of semiconductor material (e.g., p-type). The kinetic energy generator may generate electricity when the computing device is being transported by turning the movement into electricity using either a piezo-based generator or a liner-induction based generator. In this way, by charging the computing device (i) when the computing device is being transported and (ii) when the computing device is being used, the battery life may be extended, enabling the user to use the computing device for a longer period of time.

Figure 5:
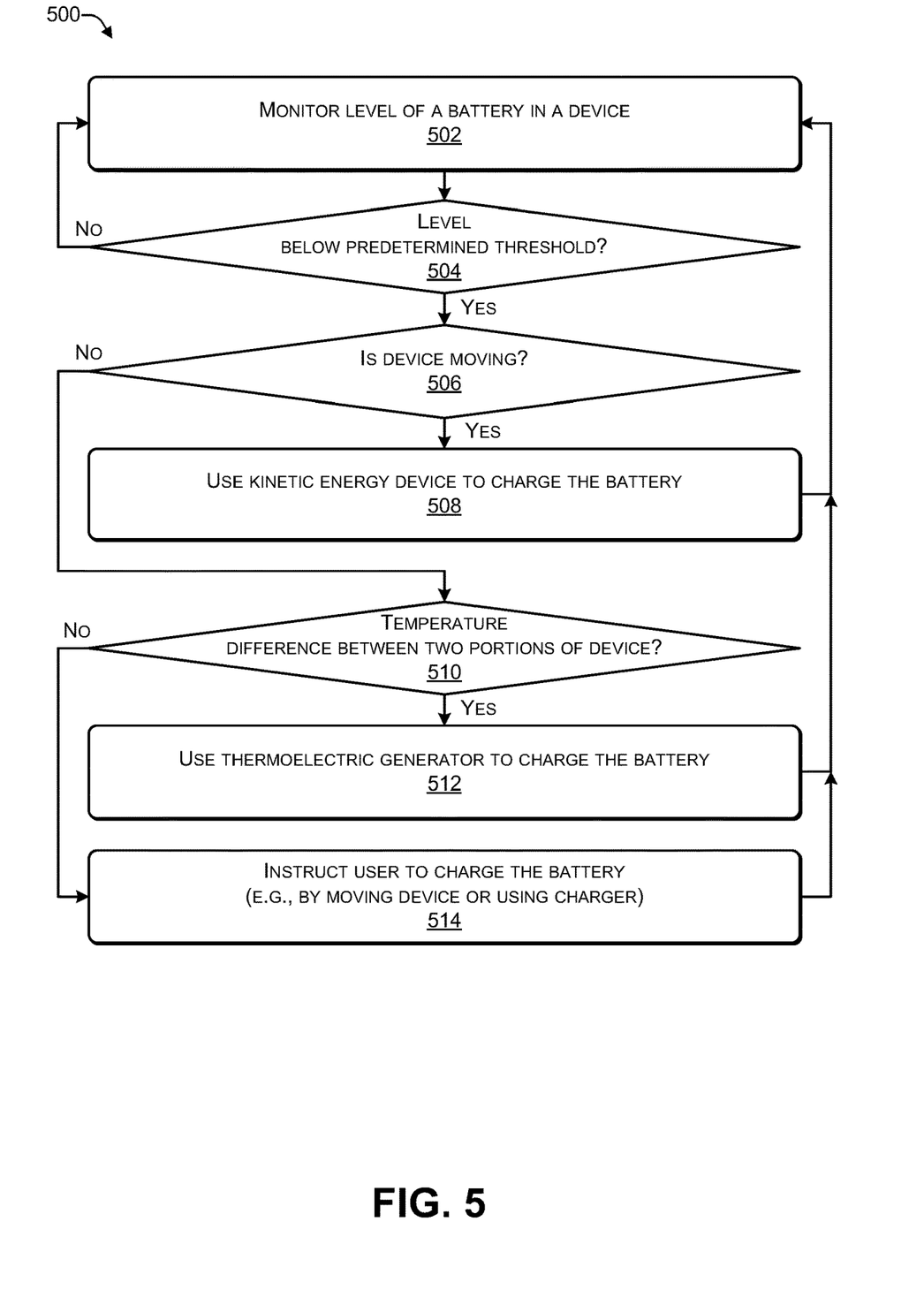
FIG. 5 is a flow diagram of a process that includes using thermal energy or kinetic energy to charge a battery according to some embodiments.

In the flow diagram of FIG. 5, each block represents one or more operations that can be implemented in hardware, software, or a combination thereof. In the context of software, the blocks represent computer-executable instructions that, when executed by one or more processors, cause the processors to perform the recited operations. Generally, computer-executable instructions include routines, programs, objects, modules, components, data structures, and the like that perform particular functions or implement particular abstract data types. The order in which the blocks are described is not intended to be construed as a limitation, and any number of the described operations can be combined in any order and/or in parallel to implement the processes. For discussion purposes, the process 500 is described with reference to FIGS. 1, 2, 3, and 4 as described above, although other models, frameworks, systems and environments may be used to implement these processes.

FIG. 5 is a flow diagram of a process 500 that includes using thermal energy or kinetic energy to charge a battery according to some embodiments. The process 500 may be performed by the EC 118 of FIGS. 1 and 4.

At 502, the process may monitor a level of a battery in a device (e.g., a computing device or a stylus). At 504, the process may determine if the level is below a predetermined threshold (e.g., percentage). If the process determines, at 504, that the level is not below the predetermined threshold, then the process may proceed to 502 and continue to monitor the battery level. If the process determines, at 504, that the level is below the predetermined threshold, then the process may proceed to 506. For example, in FIG. 1, the EC 118 may monitor a level of the battery 124. If the EC 118 determines that the level of the battery 124 has not fallen below a predetermined threshold, such as, for example, 10%, 15, or 20% remaining, then the EC 118 may continue to monitor the level of the battery 124.

At 506, the process may determine if the device is moving. If the process determines, at 506, that the device is moving, then the process may proceed to 508 to charge the battery using kinetic energy, and the process may proceed to 502 to monitor the battery level. If the process determines, at 506, that the device is stationary (e.g., not moving), then the process may proceed to 510. For example, in FIG. 1, the EC 118 may determine based on sensor data (e.g., data from an accelerometer, a global positioning system (GPS), or another type of motion-related sensor) whether the device (e.g., the computing device 102 or the stylus 106) is moving. If the EC 118 determines based on the sensor data that the device (e.g., the computing device 102 or the stylus 106) is moving, then the EC 118 may use the kinetic energy generator 116 to charge the battery 124 (e.g., by connecting an output of the kinetic energy generator 116 to a charge input of the battery 124). The EC 118 may continue to monitor a level of the battery 124.

At 510, the process may determine if there is a temperature difference between two portions of the device. If the process determines, at 510, that a temperature difference between two portions of the device satisfies a predetermined threshold, then the process may proceed to 512 to charge the battery using a thermoelectric generator and the process may proceed to 502 to monitor the battery level. If the process determines, at 510, that the temperature difference between the two portions of the device does not satisfy the predetermined threshold, then the process may proceed to 514. For example, in FIG. 1, the EC 118 may determine based on sensor data (e.g., data from a thermometer or another type of temperature-related sensor) whether a temperature difference between two portions of the device (e.g., the computing device 102 or the stylus 106) satisfies a predetermined threshold (e.g., the temperature difference is at least a predetermined amount, such as 4, 6, 8, 10 or greater degrees Fahrenheit). For example, in FIG. 1 and FIG. 4, for the stylus 106, if the EC 118 determines that the temperature difference between the first portion 126 and the second portion 128 satisfies the predetermined threshold, then the EC 118 may use the thermoelectric generator 112 to charge the battery 124 (e.g., by connecting an output of the thermoelectric generator 112 to a charge input of the battery 124). The EC 118 may continue to monitor a level of the battery 124. As another example, in FIG. 4, for the computing device 102, if the EC 118 determines that the temperature difference between the first portion 412 and the second portion 414 satisfies the predetermined threshold (e.g., 4, 6, 8, 10 or greater degrees Fahrenheit), then the EC 118 may use the thermoelectric generator 112 to charge the battery 124 (e.g., by connecting an output of the thermoelectric generator 112 to a charge input of the battery 124). The EC 118 may continue to monitor a level of the battery 124.

At 514, the user may be instructed to charge the battery (e.g., either by moving the device or by plugging a charger into the device), and the process may proceed to 502 to monitor the battery level. For example, in FIG. 1, if the EC 118 determines that the device (e.g., the computing device 102 or the stylus 106) is not moving and that a temperature difference between two portions of the device do not satisfy a predetermined threshold, then the EC 118 may instruct the user to charge the device. For example, when the computing device 102 is a laptop or a tablet device, charging the computing device 102 may include connecting (e.g., wirelessly or via a cable) a power supply (e.g., AC to DC power supply) to the computing device 102. When the computing device 102 is a smartwatch or a smartphone or the device is the stylus 106, charging the device may include connecting (e.g., wirelessly or by using a cable) a power supply to the device or moving the device back and forth a predetermined distance (e.g., 8, 10, 12, 14, 16 or the like inches) a predetermined number of times (e.g., 10, 20, 30 or the like). Moving the device may cause the EC 118 to charge the battery using the kinetic energy generator 116.

Figure 6:
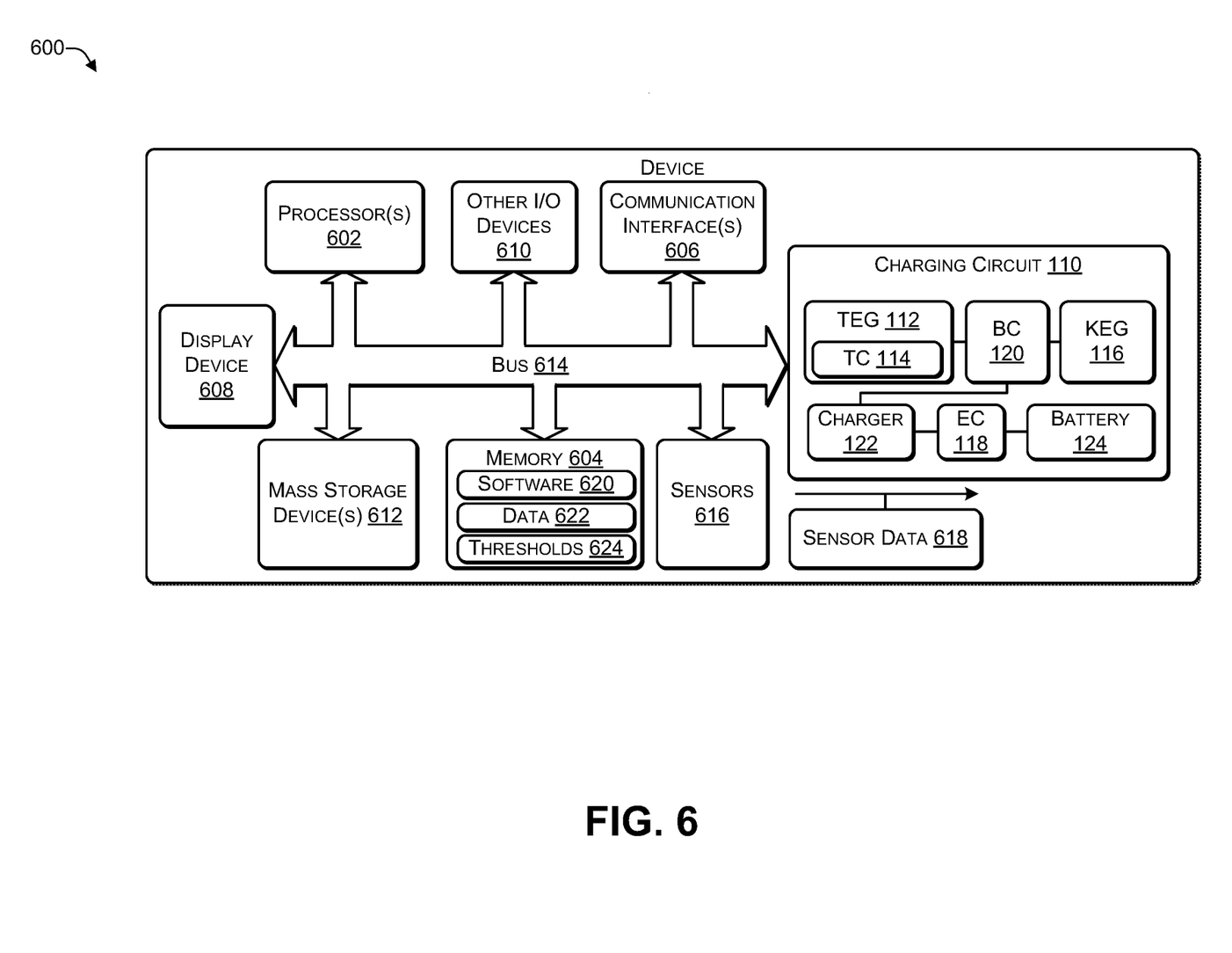
FIG. 6 illustrates an example configuration of a device 600 that can be used to implement the systems and techniques described herein.

FIG. 6 illustrates an example configuration of a device 600 that can be used to implement the systems and techniques described herein, such as for example, the computing device 102 and the stylus 106 of FIG. 1 and FIG. 4.

The device 600 may include one or more processors 602 (e.g., CPU, graphic processing unit (GPU), digital signal processor (DSP) or the like), a memory 604, communication interfaces 606, a display device 608, other input/output (I/O) devices 610 (e.g., keyboard, trackball, and the like), one or more sensors 616 (e.g., accelerometer, GPS, thermometer, and the like), and one or more mass storage devices 612 (e.g., disk drive, solid state disk drive (SSD), or the like), configured to communicate with each other, such as via one or more system buses 614 or other suitable connections. While a single system bus 614 is illustrated for ease of understanding, it should be understood that the system buses 614 may include multiple buses, such as a memory device bus, a storage device bus (e.g., serial ATA (SATA) and the like), data buses (e.g., universal serial bus (USB) and the like), video signal buses (e.g., ThunderBolt®, DVI, HDMI, and the like), power buses, etc.

The processors 602 are one or more hardware devices that may include a single processing unit or a number of processing units, all of which may include single or multiple computing units or multiple cores. The processors 602 may include a graphics processing unit (GPU) that is integrated into the CPU or the GPU may be a separate processor device from the CPU. The processors 602 may be implemented as one or more microprocessors, microcomputers, microcontrollers, digital signal processors, central processing units, graphics processing units, state machines, logic circuitries, and/or any devices that manipulate signals based on operational instructions. Among other capabilities, the processors 602 may be configured to fetch and execute computer-readable instructions stored in the memory 604, mass storage devices 612, or other computer-readable media.

Memory 604 and mass storage devices 612 are examples of computer storage media (e.g., memory storage devices) for storing instructions that can be executed by the processors 602 to perform the various functions described herein. For example, memory 604 may include both volatile memory and non-volatile memory (e.g., RAM, ROM, or the like) devices. Further, mass storage devices 612 may include hard disk drives, solid-state drives, removable media, including external and removable drives, memory cards, flash memory, floppy disks, optical disks (e.g., CD, DVD), a storage array, a network attached storage, a storage area network, or the like. Both memory 604 and mass storage devices 612 may be collectively referred to as memory or computer storage media herein and may be any type of non-transitory media capable of storing computer-readable, processor-executable program instructions as computer program code that can be executed by the processors 602 as a particular machine configured for carrying out the operations and functions described in the implementations herein.

The device 600 may include one or more communication interfaces 606 for exchanging data via the network 106. The communication interfaces 606 can facilitate communications within a wide variety of networks and protocol types, including wired networks (e.g., Ethernet, DOCSIS, DSL, Fiber, USB etc.) and wireless networks (e.g., WLAN, GSM, CDMA, 802.11, Bluetooth, Wireless USB, ZigBee, cellular, satellite, etc.), the Internet and the like. Communication interfaces 606 can also provide communication with external storage, such as a storage array, network attached storage, storage area network, cloud storage, or the like.

The display device 608 may be used for displaying content (e.g., information and images) to users. Other I/O devices 610 may be devices that receive various inputs from a user and provide various outputs to the user, and may include a keyboard, a touchpad, a mouse, a printer, audio input/output devices, and so forth.

The computer storage media, such as memory 604 and mass storage devices 612, may be used to store software and data. For example, the computer storage media may be used to store software 620 (e.g., operating system, drivers, software applications, and the like), data 622, and thresholds 624.

The device 600 may be powered using the charging circuit 110. The EC 118 may monitor a level of the battery 124. If the EC 118 determines that the level of the battery 124 has not fallen below a first predetermined threshold of the thresholds 624, such as, for example, 10%, 15%, or 20% remaining, then the EC 118 may continue to monitor the level of the battery 124. If the EC 118 determines that the level of the battery 124 has fallen below the first predetermined threshold, then the EC 118 may determine based on sensor data 618 (e.g., data from the sensors 616, such as an accelerometer, a global positioning system (GPS), or another type of motion-related sensor) whether the device 600 is moving. If the EC 118 determines based on the sensor data 618 that the device 600 is moving, then the EC 118 may use the kinetic energy generator (KEG) 116 to charge the battery 124. The EC 118 may continue to monitor a level of the battery 124.

If the EC 118 determines that (i) the level of the battery 124 has fallen below the first predetermined threshold, and (ii) the device 600 is not moving, then the EC 118 may determine based on the sensor data 618 (e.g., data from a thermometer or another type of temperature-related sensor) whether a temperature difference between two portions of the device 600 satisfies a second predetermined threshold (e.g., 4, 6, 8, 10 or greater degrees Fahrenheit) of the thresholds 624. If the EC 118 determines that the temperature difference between the first portion 126 and the second portion 128 satisfies the second predetermined threshold, then the EC 118 may use the thermoelectric generator 112 to charge the battery 124. The EC 118 may continue to monitor a level of the battery 124.

If the EC 118 determines that (i) the level of the battery 124 has fallen below the first predetermined threshold, (ii) the device 600 is not moving, and (iii) the temperature difference between two portions of the device do not satisfy the second predetermined threshold, then the EC 118 may instruct the user to charge the device 600. For example, when the device 600 is a laptop or a tablet device, charging the device 600 may include connecting (e.g., wirelessly or via a cable) a power supply (e.g., AC to DC power supply) to the device 600. When the device 600 is a smartwatch, a smartphone, or the stylus 106, charging the device 600 may include connecting (e.g., wirelessly or by using a cable) a power supply to the device 600 or moving the device 600 back and forth a predetermined distance (e.g., 8, 10, 12, 14, 16 or the like inches) a predetermined number of times (e.g., 10, 20, 30 or the like). Moving the device 600 may cause the EC 118 to charge the battery using the kinetic energy generator 116.

The example systems and computing devices described herein are merely examples suitable for some implementations and are not intended to suggest any limitation as to the scope of use or functionality of the environments, architectures and frameworks that can implement the processes, components and features described herein. Thus, implementations herein are operational with numerous environments or architectures, and may be implemented in general purpose and special-purpose computing systems, or other devices having processing capability. Generally, any of the functions described with reference to the figures can be implemented using software, hardware (e.g., fixed logic circuitry) or a combination of these implementations. The term "module," "mechanism" or "component" as used herein generally represents software, hardware, or a combination of software and hardware that can be configured to implement prescribed functions. For instance, in the case of a software implementation, the term "module," "mechanism" or "component" can represent program code (and/or declarative-type instructions) that performs specified tasks or operations when executed on a processing device or devices (e.g., CPUs or processors). The program code can be stored in one or more computer-readable memory devices or other computer storage devices. Thus, the processes, components and modules described herein may be implemented by a computer program product.

Furthermore, this disclosure provides various example implementations, as described and as illustrated in the drawings. However, this disclosure is not limited to the implementations described and illustrated herein, but can extend to other implementations, as would be known or as would become known to those skilled in the art. Reference in the specification to "one implementation," "this implementation," "these implementations" or "some implementations" means that a particular feature, structure, or characteristic described is included in at least one implementation, and the appearances of these phrases in various places in the specification are not necessarily all referring to the same implementation.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A device comprising:
    a charging circuit comprising:

a kinetic energy generator comprising a chamber;
a first spring located at one end of the chamber;
a second spring located at an opposite end of the chamber;
wire coiled around an exterior surface of the chamber; and
a neodymium magnet inside the chamber, wherein when the chamber experiences motion, a weighted object travels inside the chamber between the first spring and the second spring to induce a current in the wire;
a battery;
a plurality of sensors comprising an accelerometer; and
an embedded controller configured with logic instructions to perform operations comprising:
determining that a level of the battery is below a first predetermined threshold;
receiving motion data from the accelerometer;
determining, based on the motion data, that the device is being moved; and
connecting an output of the kinetic energy generator to an input of the battery to charge the battery.

2. The device of claim 1, wherein the charging circuit further comprises:
a thermoelectric generator.

3. The device of claim 2, the operations further comprising:
determining that the level of the battery is below the first predetermined threshold;
receiving second motion data from the accelerometer;
determining, based on the motion data, that the device is stationary;
receiving temperature data from a thermometer of the plurality of sensors;
determining, based on the temperature data, that a temperature difference between a first portion of the device and a second portion of the device satisfies a second predetermined threshold; and
connecting an output of the thermoelectric generator to the input of the battery to charge the battery.

4. The device of claim 2, the operations further comprising:
determining that the level of the battery is below the first predetermined threshold;
receiving second motion data from the accelerometer;
determining, based on the motion data, that the device is stationary;
receiving temperature data from a thermometer of the plurality of sensors;
determining, based on the temperature data, that a temperature difference between a first portion of the device and a second portion of the device fails to satisfy a second predetermined threshold; and
instructing the user to charge the battery.

5. The device of claim 4, wherein instructing the user to charge the battery comprises instructing the user to perform at least one of:
placing the device on a charging mat to wirelessly charge the battery;
connecting a power source to the device to charge the battery; or
moving the device at least a predetermined distance, at least a predetermined number of times.

6. A computing device comprising:
a charging circuit comprising:
a kinetic energy generator comprising a chamber;
a first spring located at one end of the chamber;
a second spring located at an opposite end of the chamber;
wire coiled around an exterior surface of the chamber; and
a neodymium magnet inside the chamber, wherein when the chamber experiences motion, a weighted object travels inside the chamber between the first spring and the second spring to induce a current in the wire;
a battery;
a plurality of sensors comprising an accelerometer and a thermometer; and
an embedded controller configured with logic instructions to perform operations comprising:
determining that a level of the battery is below a first predetermined threshold;
receiving motion data from the accelerometer;
determining, based on the motion data, that the device is being moved; and
connecting an output of the kinetic energy generator to an input of the battery to charge the battery.

7. The computing device of claim 6, wherein the charging circuit further comprises:
a thermoelectric generator.

8. The computing device of claim 7, the operations further comprising:
determining that the level of the battery is below the first predetermined threshold;
receiving second motion data from the accelerometer;
determining, based on the motion data, that the device is stationary;
receiving temperature data from the thermometer;
determining, based on the temperature data, that a temperature difference between a first portion of the device and a second portion of the device satisfies a second predetermined threshold; and
connecting an output of the thermoelectric generator to the input of the battery to charge the battery.

9. The computing device of claim 7, the operations further comprising:
determining that the level of the battery is below the first predetermined threshold;
receiving second motion data from the accelerometer;
determining, based on the motion data, that the device is stationary;
receiving temperature data from the thermometer;
determining, based on the temperature data, that a temperature difference between a first portion of the device and a second portion of the device fails to satisfy a second predetermined threshold; and
instructing the user to charge the battery by moving the device at least a predetermined distance, at least a predetermined number of times.

10. A stylus comprising:
a charging circuit comprising:
a kinetic energy generator comprising a chamber;
a first spring located at one end of the chamber;
a second spring located at an opposite end of the chamber;
wire coiled around an exterior surface of the chamber; and
a neodymium magnet inside the chamber, wherein when the chamber experiences motion, a weighted object travels inside the chamber between the first spring and the second spring to induce a current in the wire;
a battery;
a plurality of sensors comprising an accelerometer; and an embedded controller configured with logic instructions to perform operations comprising:

determining that a level of the battery is below a first predetermined threshold;

receiving motion data from the accelerometer;

determining, based on the motion data, that the device is being moved; and connecting an output of the kinetic energy generator to an input of the battery to charge the battery.

11. The stylus of claim 10 wherein the charging circuit further comprises:

a thermoelectric generator.

12. The stylus of claim 11, the operations further comprising:

determining that the level of the battery is below the first predetermined threshold;

receiving second motion data from the accelerometer;

determining, based on the motion data, that the device is stationary;

receiving temperature data from a thermometer of the plurality of sensors;

determining, based on the temperature data, that a temperature difference between a first portion of the device and a second portion of the device satisfies a second predetermined threshold; and connecting an output of the thermoelectric generator to the input of the battery to charge the battery.

13. The stylus of claim 11, the operations further comprising:

determining that the level of the battery is below the first predetermined threshold;

receiving second motion data from the accelerometer;

determining, based on the motion data, that the device is stationary;

receiving temperature data from a thermometer of the plurality of sensors;

determining, based on the temperature data, that a temperature difference between a first portion of the device and a second portion of the device fails to satisfy a second predetermined threshold; and instructing the user to charge the battery.

14. The stylus of claim 13, wherein instructing the user to charge the battery comprises instructing the user to perform at least one of:

placing the device on a charging mat to wirelessly charge the battery;

connecting a power source to the device to charge the battery; or moving the device at least a predetermined distance, at least a predetermined number of times.

* * * * *